United States Patent
Maki et al.

(10) Patent No.: US 8,991,681 B2
(45) Date of Patent: Mar. 31, 2015

(54) DIE BONDER AND BONDING METHOD

(75) Inventors: Hiroshi Maki, Kumagaya (JP);
Masayuki Mochizuki, Kumagaya (JP);
Yukio Tani, Kumagaya (JP); Takehito Mochizuki, Kumagaya (JP)

(73) Assignee: Hitachi High-Tech Instuments Co., Ltd., Kumagaya-shi (JP)

( * ) Notice: Subject to any disclaimer, the term of this patent is extended or adjusted under 35 U.S.C. 154(b) by 70 days.

(21) Appl. No.: 13/412,684

(22) Filed: Mar. 6, 2012

(65) Prior Publication Data

US 2013/0068823 A1    Mar. 21, 2013

(30) Foreign Application Priority Data

Sep. 15, 2011 (JP) .................. 2011-202273

(51) Int. Cl.
| | |
|---|---|
| *B23K 31/00* | (2006.01) |
| *B23K 31/02* | (2006.01) |
| *H01L 21/67* | (2006.01) |
| *H01L 21/68* | (2006.01) |
| *H01L 23/00* | (2006.01) |
| *H01L 21/00* | (2006.01) |
| *H01L 21/02* | (2006.01) |
| *H01L 21/677* | (2006.01) |
| *H01L 21/64* | (2006.01) |

(52) U.S. Cl.
CPC ............... *H01L 24/75* (2013.01); *H01L 24/00* (2013.01); *H01L 21/68* (2013.01); *H01L 24/10* (2013.01); *H01L 21/00* (2013.01); *H01L 21/02* (2013.01); *H01L 21/677* (2013.01); *H01L 21/64* (2013.01); *H01L 21/682* (2013.01); *H01L 21/67* (2013.01); *H01L 24/01* (2013.01); *H01L 24/02* (2013.01); *H01L 21/67144* (2013.01)

USPC .................. 228/180.1; 228/180.5; 228/122.1; 228/123.1

(58) Field of Classification Search
CPC ......... H01L 21/00; H01L 21/02; H01L 21/64; H01L 21/67; H01L 21/68; H01L 21/682; H01L 21/677; H01L 21/67703; H01L 21/67098; H01L 21/67121; H01L 21/67132; H01L 21/67144; H01L 21/673; H01L 24/00; H01L 24/01; H01L 24/02; H01L 24/10
USPC ...................... 228/180.1, 180.5, 122.5, 122.1
See application file for complete search history.

(56) References Cited

U.S. PATENT DOCUMENTS

| | | | |
|---|---|---|---|
| 2002/0017367 A1* | 2/2002 | Kitaguchi | ...................... 156/556 |
| 2003/0071109 A1* | 4/2003 | Arikado | ..................... 228/180.1 |

FOREIGN PATENT DOCUMENTS

JP    2009-246285 A    10/2009

* cited by examiner

*Primary Examiner* — Erin Saad
(74) *Attorney, Agent, or Firm* — Crowell & Moring LLP

(57) ABSTRACT

A die bonder and a bonding method are disclosed which make it possible to provide high-quality products, particularly even if a die is rotated through predetermined degrees relative to an already-bonded die and then laminated.
In the die bonder and bonding method in which a die is picked up from a wafer by a pick-up head which then places the die on an alignment stage, and the die is picked up from the alignment stage by a bonding head which then bond the die onto a substrate or an already-bonded die, a posture of the die is rotated through predetermined degrees on a plane parallel to a plane on which the bonding is performed, before the bonding head picks up the die from the alignment stage.

1 Claim, 5 Drawing Sheets

DIE BONDER AND BONDING METHOD

BACKGROUND OF THE INVENTION

The present invention relates to a die bonder and a die bonding method and, more particularly, to a die bonder and a die bonding method which make it possible to provide high-quality products.

A step of mounting a die (semiconductor chip) (merely referred to hereinafter as "die") on a substrate such as a wiring substrate or a lead frame to assemble a packages comprises the sub-steps of dividing a die from a semiconductor wafer (merely referred to hereinafter as "wafer"), and bonding and laminating the divided die onto the substrate or an already-bonded die.

As a process implementing the bonding step, there is known a process which comprises the steps of placing a picked-up die on a parts-carrying table (alignment stage) once, and again picking up the die from the parts-carrying table by a bonding head and bonding it onto a substrate which has been conveyed (Japanese Patent Application Laid-Open Publication No. 2009-246285 (Patent Literature 1)).

On the other hand, in the fields of Flash memories, mobile RAMs (Random Access Memories), etc., there is demand to bond and by laminating a zero-degree oriented non-rotated-die and a 180 degree-rotated die. In order to meet such a demand, the bonding head is rotated through 180 degrees and the bonding is then performed, in the technology in which the die is once placed on the parts-carrying table as described in the Patent Literature 1.

SUMMARY OF THE INVENTION

However, if the bonding head is rotated, a bonding surface is inclined by the inclination of a rotating shaft or the inclination of the rotating shaft and collet. Adjustment can be performed on at least one side of the zero degree and the 180 degrees. Even if the posture of any one of them can be correctly adjusted, inclination in the posture of the other is produced. As a result, when the die is rotated through 180 degrees relative to the already-bonded die and bonded laminated to the already-bonded die, a void is likely to be produced between the dies. Moreover, the inclination causes a rotation center deviation to be produced, thus deteriorating lamination accuracy. Eventually, by these causes, the quality of products is deteriorated. Moreover, even if the die is bonded merely or bonded in the other posture onto the substrate, the inclination is also produced and the same problems are present although they are less serious than the case of the lamination.

It is therefore an object of the present invention to particularly provide a die bonder and a bonding method which make it possible to provide high-quality products even if a die is rotated through 180 degrees relative to an already-bonded die and laminated to it.

In accordance with one aspect of the present invention, there is provided a die bonder which comprises a die supplying section holding a wafer, a pick-up head picking up a die from the wafer and placing the die on an alignment stage, a bonding head picking up the die from the alignment stage and bonding the die onto a substrate or an already-bonded die, and a die rotating means rotating a posture of the die through predetermined degrees on a plane parallel to a plane on which the bonding is performed, before the bonding head picks up the die from the alignment stage.

According to another aspect of the present invention, there is provided a bonding method which comprises a picking-up step of picking up a die from a wafer by a pick-up head and placing the die on an alignment stage, a bonding step of picking up the die from the alignment stage by a bonding head and bonding the die onto a substrate or an already-bonded die, and a die rotating step of rotating a posture of the die through predetermined degrees on a plane parallel to a plane on which the bonding is performed, before the bonding head picks up the die from the alignment stage.

The present invention may include a judging whether the die is rotated through the predetermined degrees, before the bonding head picks up the die from the alignment stage.

Moreover, the present invention may includes the bonding step of rotating the die through the predetermined degrees and performing the bonding and the step of bonding the die without rotating through the predetermined degrees may be alternately performed.

Moreover, the die rotating step may be performed by rotating the alignment stage.

Moreover, the die rotating step may be performed by rotating the pick-up head through predetermined degrees.

Moreover, the predetermined degrees may be 180 degrees or 90 degrees.

Moreover, the present invention may include the die supplying section is adapted to hold a plurality of wafers, two alignment stages are provided, the two alignment stages being capable of carrying a plurality of dies thereon, and the die bonder includes means which causes the two alignment stages to be moved in directions opposite to each other parallel to movement direction of the bonding head.

Therefore, according to the present invention, it is possible to provide the die bonder and bonding method which make it possible to provide high-quality products particularly even if the die is rotated through the predetermined degrees relative to the already-bonded die and then laminated.

DESCRIPTION OF THE PREFERRED EMBODIMENTS

Embodiments of the present invention will be explained hereinafter with reference to the drawings.

Embodiment 1

Figure 1:
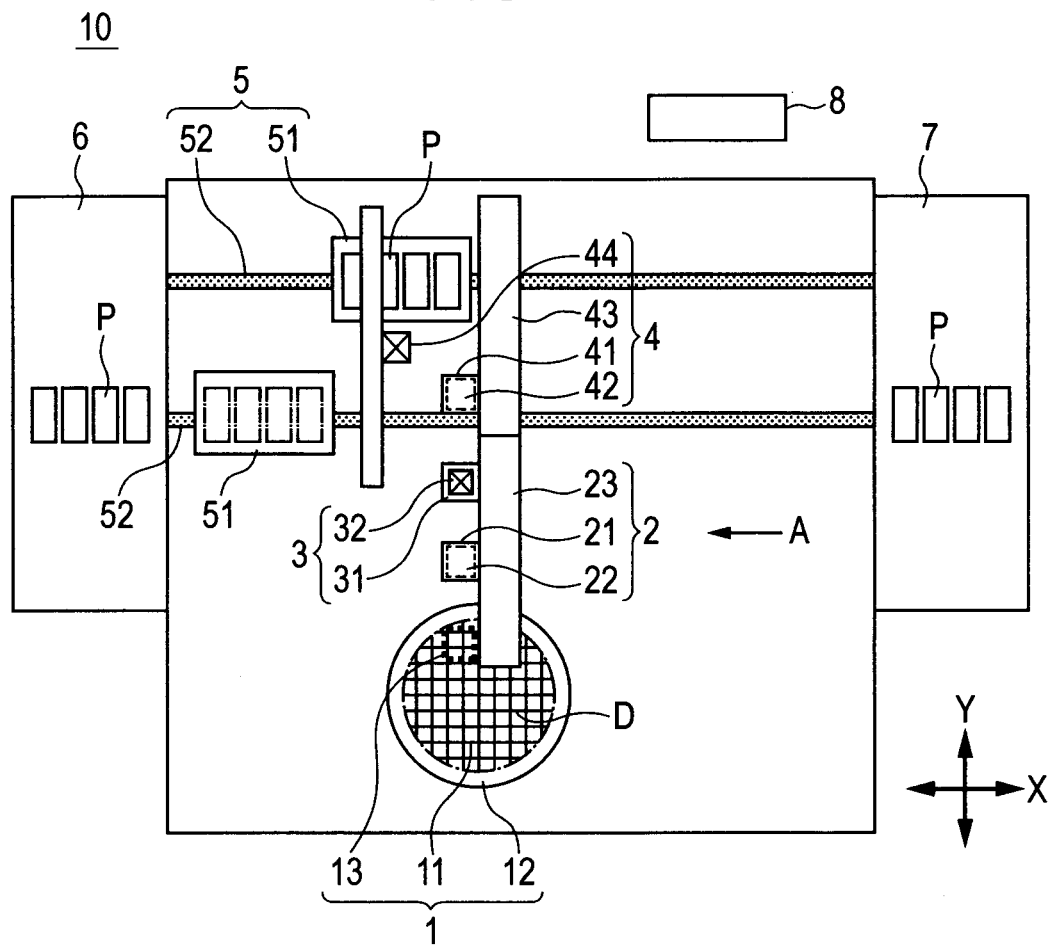
FIG. 1 is a schematic top plan view of a die bonder 10 according to an embodiment 1 of the present invention.
Figure 2:
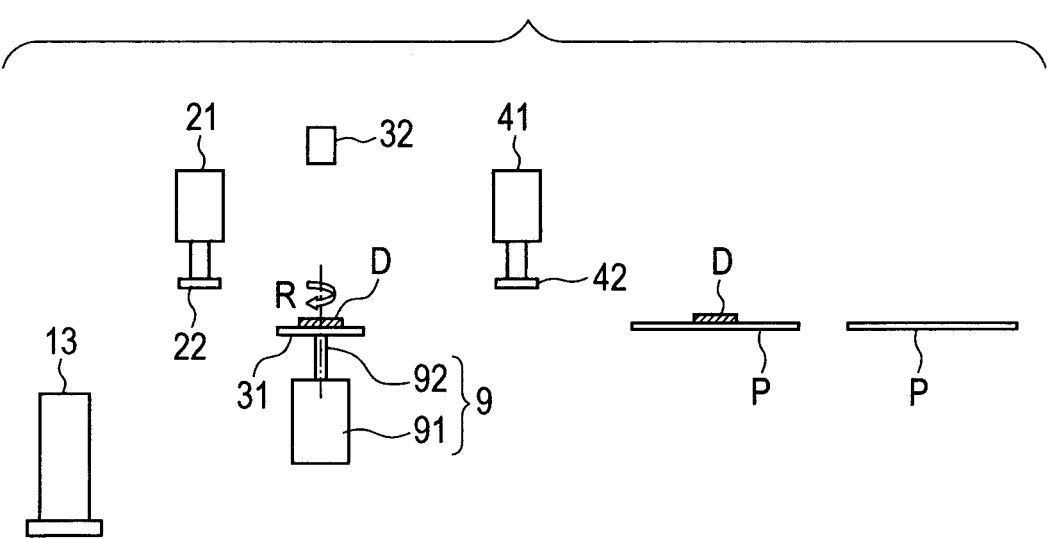
FIG. 2 is a view showing the structure and operation of a working example 1 of a die rotating means characteristic of the embodiment 1 of the present invention.

FIG. 1 is a schematic top plan view of a die bonder 10 according to an embodiment 1 of the present invention. FIG. 2 is a view which explains a structure characteristic of this embodiment as viewed from an arrow A direction in FIG. 1, and the operation thereof.

The die bonder 10 generally includes a die supplying section 1 supplying a die D which is to be mounted on a substrate P, a pick-up section 2 picking up the die from the die supply section 1, an alignment section 3 on which the picked-up die D is to be temporarily carried once, a bonding section 4 picking up the die D on the alignment section 3 and bonding it onto the substrate P or an already-bonded die, a conveying section 5 conveying the substrate P to a die-mounting position, a substrate supplying section 6 supplying the substrate to the conveying section 5, a substrate unloading section 7 receiving a die-mounted substrate, and a control section 8 monitoring and controlling the operations of the respective sections.

The die supplying section 1 includes a wafer holding base 12 holding a wafer 11, and a push-up unit 13 which pushes up the die D from the wafer 11 and is indicated by broken line. The die supplying section 1 is adapted to be moved in an X-Y direction by an unshown drive means and move the die D, to be picked up, to a position of the push-up unit 13.

The pick-up section 2 includes a pick-up head picking up the die D pushed up by the push-up unit 13 and placing it on the alignment section 3, and a Y-drive section 23 moving the pick-up head 21 in a Y direction. The pick-up head 21 includes a collet 22 (also refer to FIG. 2) at a tip end thereof. The collet 22 sucks the die D. And also the pick-up head 21 includes unshown drive sections causing the collet 22 to go up and down, to rotate, and to move in an X-direction, respectively.

The alignment section 3 includes an alignment stage 31 on which the die D is to be temporarily carried, and a stage recognizing camera 32 for recognizing the dies D on the alignment stage 31.

The bonding section 4 has the same structure as the pick-up head does, and includes a bonding head 41 picking up the die D from the alignment stage 31 and bonding it onto the conveyed substrate P, a Y-drive portion 43 moving the bonding head 41 in the Y-direction, and a substrate recognizing camera 44 imaging a position recognizing mark (not shown) of the conveyed substrate P and recognizing a bonding position of the die D to be bonded.

With such a structure, the bonding head 41 corrects a pick-up position/posture on the basis of an image data from the stage recognizing camera 32, picks up the die D from the alignment stage 31, and bonds the die D onto the substrate P on the basis of an image date from the substrate recognizing camera 44.

The conveying section 5 includes a substrate conveying palette 51 on which one or more substrates (four substrates in FIG. 1) are carried, and a palette rail 52 along which the substrate conveying palette 51 moves. The conveying section 5 includes first and second parallely arranged conveying-portions which have the same structure, namely, each of which includes the substrate conveying palette 51 and the palette rail 52. An unshown nut which is provided at the substrate conveying palette is driven by an unshown ball screw provided along the palette rail 52, whereby the substrate conveying palette 51 is moved.

With to such a structure, the substrate is carried on the substrate conveying palette 51 at the substrate supplying section 6 and the substrate conveying palette 51 is moved to a bonding position along the palette rail 52, moved to the substrate unloading section 7 after the bonding is completed, and then delivers the substrate to the substrate unloading section 7. The first and second conveying portions are driven independently from each other. During bonding of the die D onto the substrate which is carried on one of the substrate conveying palette 51, the other of the substrate conveying palette 51 unloads the substrate P carried thereon, returns to the substrate supplying section 6, and is made ready for carrying of a new substrate.

A characteristic of this embodiment resides in the provision of a die rotating means which rotates the die D through 180 degrees on a plane parallel to a bonding plane of the die D before the bonding head 41 picks up the die D. Consequently, it is possible to bond the die D by the bonding head 41 which is always in the same zero degree posture without being rotated through 180 degrees, so that generation of a void between the dies can be decreased. Moreover, rotational center-shift due to inclination is not produced and it is possible to laminate the die with good precision. Incidentally, the posture of the bonding head 41, the inclination of which is adjusted with particularly good precision, is set to a zero degree.

Example 1

FIG. 2 shows the structure and operation of an example 1 of the die rotating means characteristic of the embodiment 1 of the present invention.

The die rotating means 9 in the example 1 is a means which rotates the alignment stage 31 through 180 degrees as indicated by an arrow R. The die rotating means 9 includes a motor 91 acting as a drive source, and a motor shaft 92 transmitting the rotation of the motor to the alignment stage 31. With this structure, after the die D is placed on the alignment stage by the pick-up head 21, the alignment stage 31 is rotated through 180 degrees. Consequently, the bonding head can perform the bonding of the die D always in the same zero-degree posture.

Figure 3:
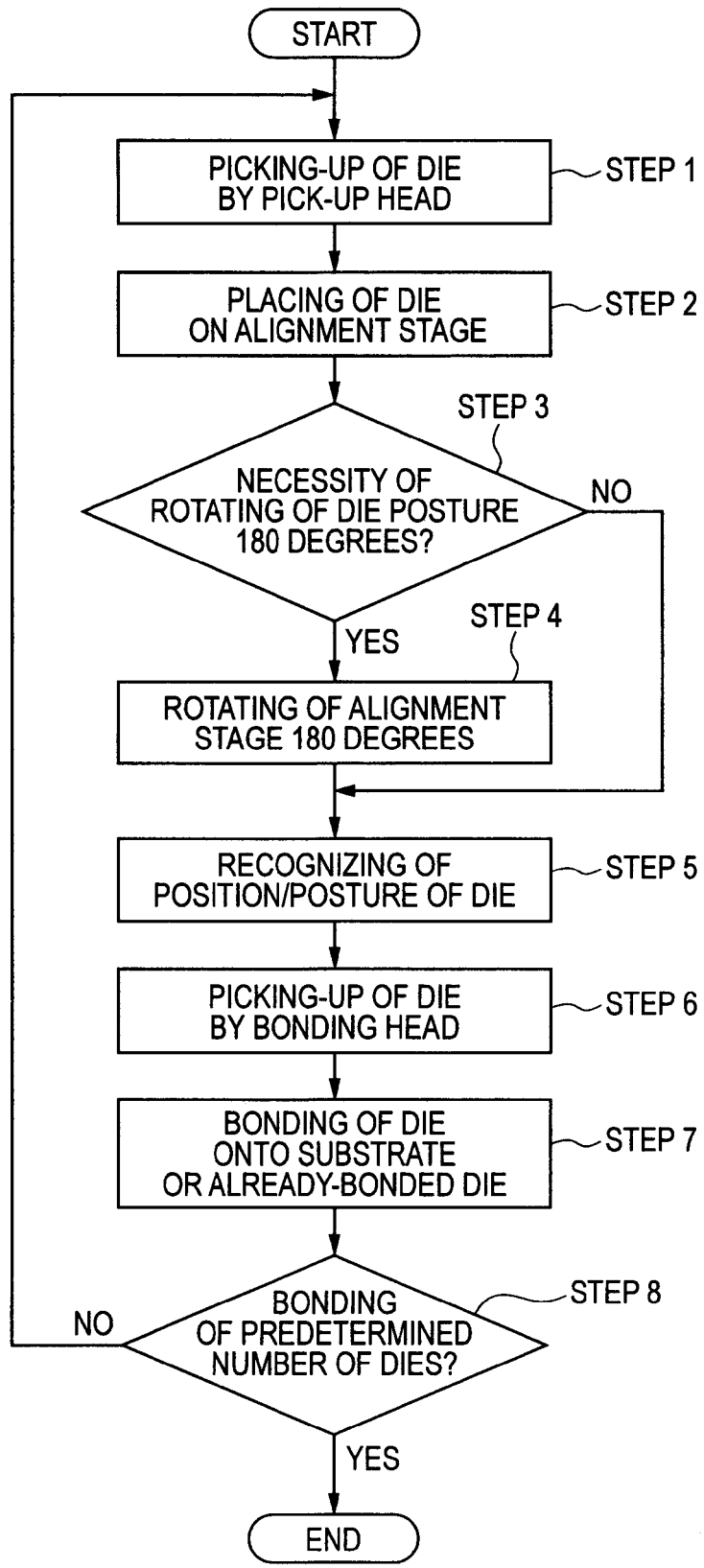
FIG. 3 is a view illustrating an operation flow in the working example 1 shown in FIG. 2.

FIG. 3 is a view showing an operation-flow in the example 1 which is illustrated in FIG. 2. The operation-flow will be explained hereinafter with reference to FIG. 3.

First of all, the pick-up head 21 picks up a die D, which has been pushed up by the push-up unit 13 and suckedly held by the collet 22 (step 1), and places it on the alignment stage 31 (step 2). Incidentally, the pick-up head 21 returns in order to pick up a die subsequent to the die D having been carried on the alignment stage. FIG. 2 shows the state.

Next, it is judged whether the posture of the die D on the alignment stage 31 is required to be rotated through 180 degrees (step 3). If required, the alignment stage 31 is rotated through 180 degrees by the rotating means 9 (step 4) and the process progresses to step 5. Unless required, the process progresses directly to the step 5.

Next, the die D and the carried state of the die are recognized by the stage recognizing camera 32 (step 5). The bonding head 41 corrects the position/posture thereof on the basis of the recognizing result and picks up the die (step 6). At this time, the bonding head 41 is rotated on the basis of the recognizing results and corrects the posture thereof. This correction is merely a level of ±1 degree. In addition, the correction amount is varied depending on circumstances. Therefore, the rotation is different from the rotation by the predetermined degrees which is characteristic of the present invention.

Next, the bonding head 41 which has picked up the die suckedly held by the collet 42 causes the die to be laminated (bonded) to the substrate P or an already-bonded die (step 7). Incidentally, FIG. 2 illustrates a state where, after bonding the die, the bonding head 41 goes toward the alignment stage 31 in order to pick up a subsequent die.

Finally, it is judged whether bonding of a predetermined number of the dies D is performed (step 8) and, unless the bonding is performed, the process is returned to the step 1. If the bonding is performed, the process is ended.

The processing flow shown in FIG. 3 also takes the case into consideration where the zero degree posture of the die and the 180 degrees posture of the die randomly occur. If the zero degree posture of the die and the 180 degrees posture of the die alternately occur, the judgment in the step 3 may not be made and processing flows for them may be provided in series.

Example 2

Figure 4:
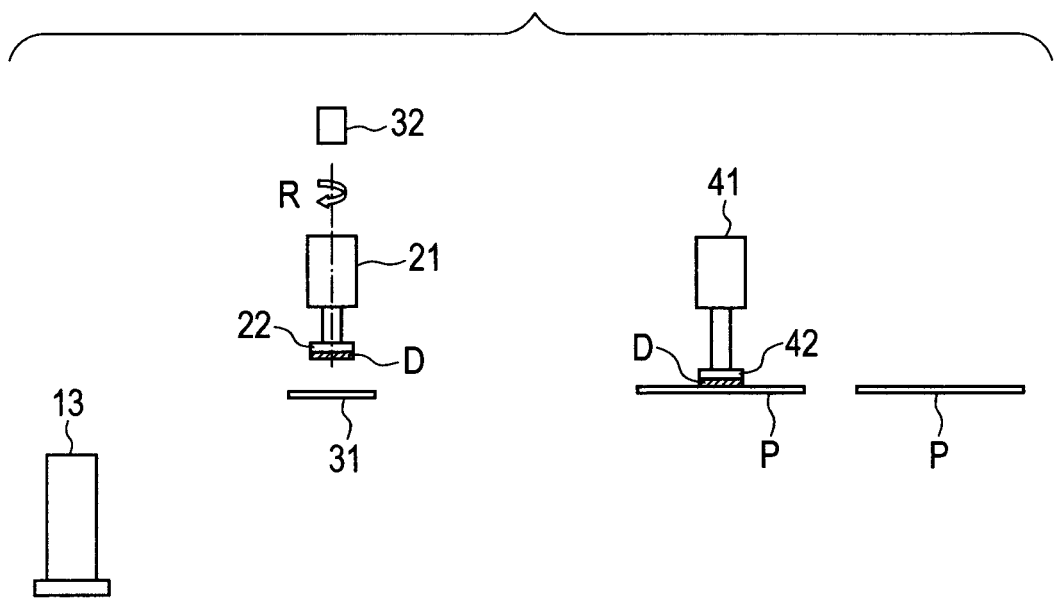
FIG. 4 is a view showing the structure and operation of a working example 2 of the die rotating means characteristic of the embodiment 1 of the present invention.

FIG. 4 is a view illustrating the structure and operation of a example 2 of the die rotating means characteristic of the embodiment 1 according to the present invention.

The difference of the example 2 from the example 1 resides in that while the alignment stage 31 is rotated through 180 degrees in the example 1 in order to rotate the posture of the die D through 180 degrees, the pick-up head 21 is rotated through 180 degrees as indicated by an arrow R in order to rotate the posture of the die D through 180 degrees and then places the die D on the alignment stage 31 in the example 2. A position where the pick-up head 21 is rotated through 180 degrees may be between the position of the push-up unit 13 and the position at which the pick-up head places the die on the alignment stage.

Incidentally, FIG. 4 shows a state where the pick-up head 21 which has arrived at a position above the alignment stage 31 and rotated the die D through 180 degrees is about to place the die on the alignment stage 31, and a state where the bonding head 41 has bonded the die onto the substrate P or the already-bonded die, synchronously with the movement of the pick-up head 21.

Figure 5:
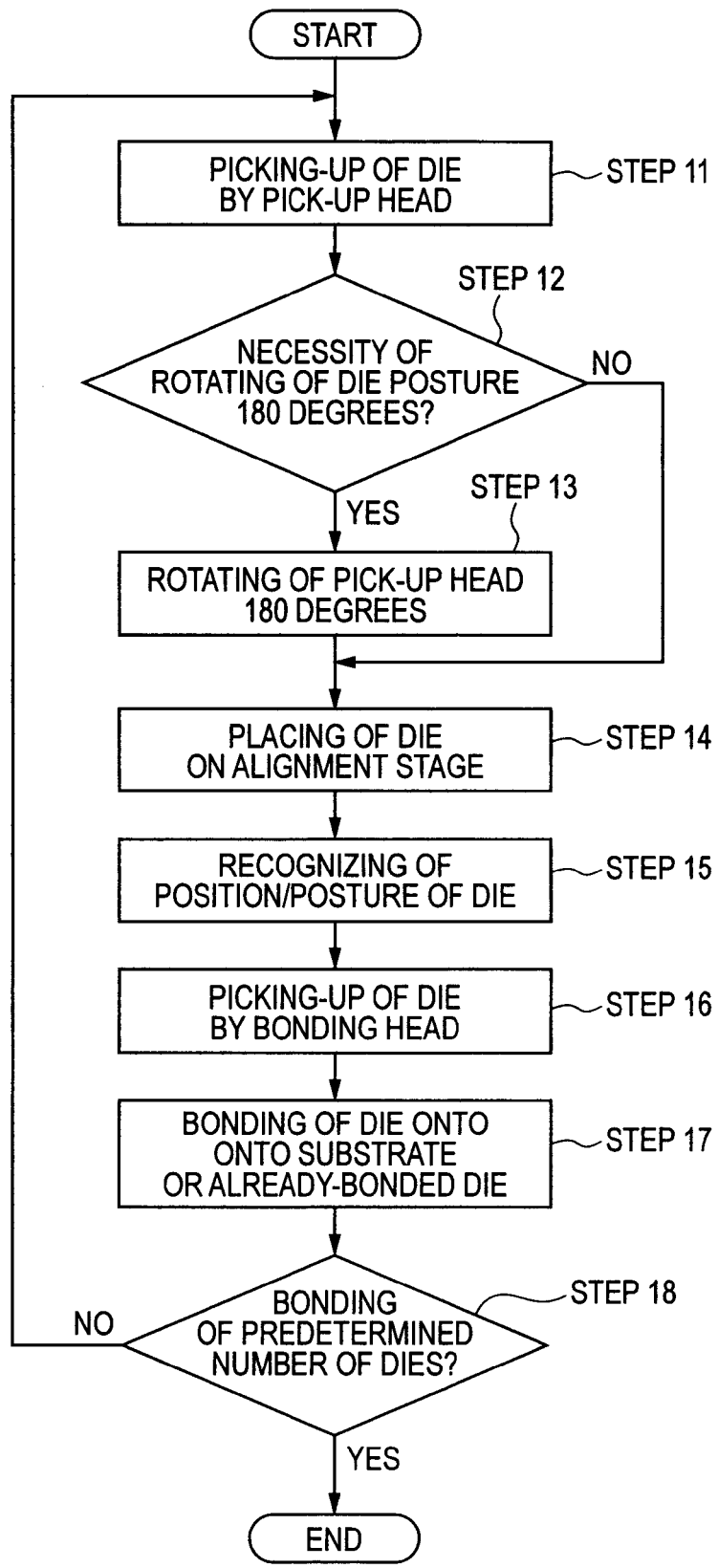
FIG. 5 is a view showing an operation flow in the working example 2 shown in FIG. 4.

FIG. 5 is a view showing an operation flow in the example 2 shown in FIG. 4. A difference of the operation flow of the example 2 from the operation flow of the example 1 shown in FIG. 3 will be explained hereinafter with reference to FIG. 4.

In the example 2, in order to cause the posture of the die D to be rotated through 180 degrees by the pick-up head 21 (step 13), a judgment is made, before the die is placed on the alignment stage 31 (step 14), whether the posture of the die D is rotated through 180 degrees (step 12). That is, as compared to the example 1, the example 2 employs an operation flow in which the step of judging whether the posture of the die D is rotated through 180 degrees and the step of placing the die D on the alignment stage 31 are changed in their order. The other points of the example 2 are identical to those of the example 1.

The processing flow shown in FIG. 5 also takes the case into consideration where the zero degree posture of the die and the 180 degrees posture of the die randomly occur. If the zero degree posture of the die and the 180 degrees posture of the die alternately occur, the judgment in the step 3 may not be made and processing flows for them may be provided in series, like the example 1.

According to the above-mentioned examples 1 and 2, the bonding head 41 performs the bonding of the die always in the same zero-degree posture without being rotated through 180 degrees, so that the production of the void between the dies can be decreased. Moreover, the rotational center-shift due to inclination is not produced and it is possible to perform the laminating of the die with good precision.

Consequently, according to the examples 1 and 2, there is provided the die bonder and bonding method which can provide high-quality products particularly even if the die is rotated through 180 degrees relative to the already-bonded die and is laminated to it.

While one die is carried on the alignment stage 31 in the examples 1 and 2 explained above, the pick-up head 21 and the bonding head 41 synchronously handle it. In order to moderate the synchronization, two dies may be carried on the alignment stage 31.

Embodiment 2

Figure 6:
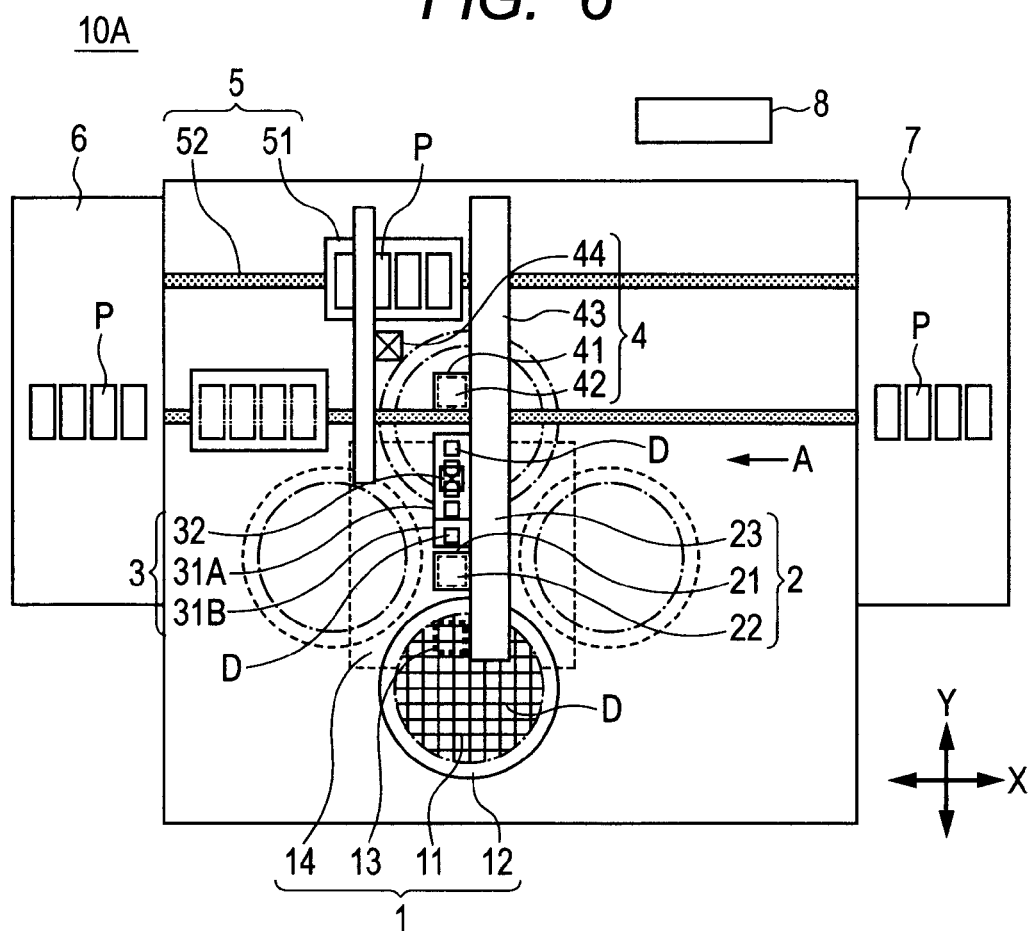
FIG. 6 is a schematic top plan view of a die bonder 10A according to an embodiment 2 of the present invention.
Figure 7:
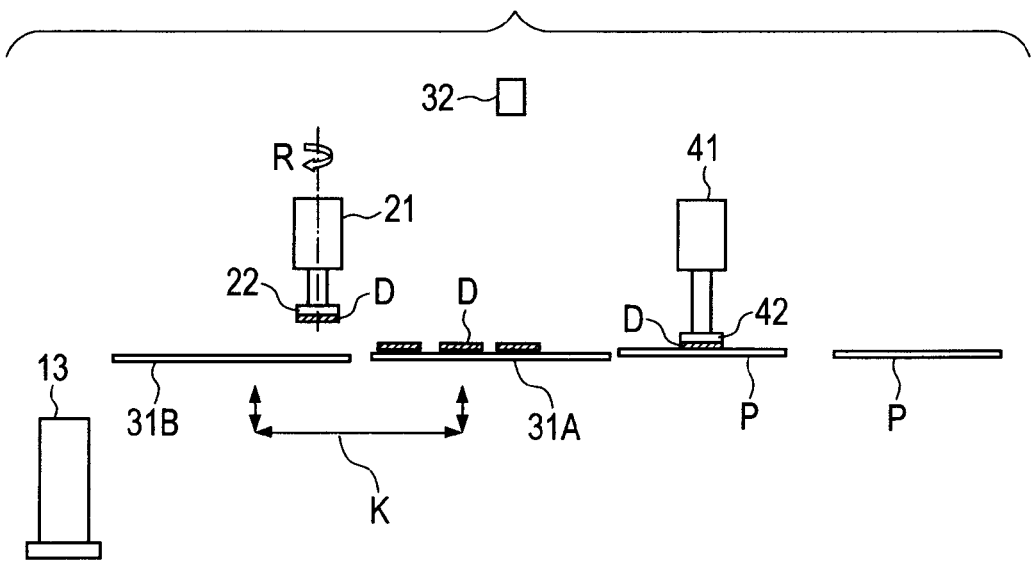
FIG. 7 is a view showing the structure and operation of a working example 3 having a die rotating means characteristic of the embodiment 2 of the present invention.

FIG. 6 is a schematic top plane view of a die bonder 10A according to an embodiment 2 of the present invention. FIG. 7 is a view which explains a structure which is characteristic of this embodiment as viewed from an arrow A direction in FIG. 6, and the operation thereof. In FIGS. 6 and 7, components having structures and functions which are identical to those of the components of the embodiment 1 are designated with like reference signs.

A difference of the embodiment 2 from the embodiment 1 resides in that a plurality of kinds of dies D can be laminated to the substrate or already-bonded dies. Therefore, a plurality of wafer holding bases 12 (four wafer holding bases in FIG. 6) are provided in such a manner to be able to supply a plurality of kinds of dies D. The four wafer holding bases 12 are fixed to four sides of a holding stage 14 shown by broken line. Like the embodiment 1, the wafer holding stage 14 includes an unshown X-Y drive section moving a predetermined die to a position above a push-up unit 13 basically made fixed, and an unshown rotation-drive section provided on the X-Y drive section for selecting the four wafer holding bases 12 (wafers 11). The term "basically" means that there is a case where a minor adjustment mechanism is employed.

The number of the wafer holding bases 12 is not limited to four, and two, three, or more than four wafer holding bases 12 may be employed. Moreover, kinds of the dies D may not correspond to the number of the wafer holding bases 12. That is, the same kind of dies may be provided on the plurality of wafer holding bases 12.

Like the embodiment 1, the embodiment 2 has a characteristic residing in the provision of a die rotating means rotating the die D through 180 degrees before the bonding head 41 picks up the die D.

Example 3

FIG. 7 is a view which shows the structure and operation of a example 3 having a die rotating means characteristic of the embodiment 2 according to the present invention.

The example 3 is provided with two alignment stages 31A, 31B, on which a plurality of dies D can be carried, in order to efficiently perform the bonding. In addition, as indicated by an arrow K, the two alignment stages 31A, 31B are adapted to be able to be reciprocated in opposite directions between different height positions by unshown moving means. Moreover, the alignment stages 31A, 31B are adapted to be able to go up and down via unshown elevator means in order that the dies D can be carried on the alignment stages and picked up at the same height position. Of course, the elevator means are not provided, the operation range of the pick-up head and bonding head 41 is extended and the height positions at which the dies are carried on the alignment stages and picked up may be varied by the two alignment stages.

The example 3 includes a die rotating means 9 which rotates the pick-up head 21 of the example 2 through 180 degrees as indicated by an arrow R, in order to handle the postures of the respective dies D as will be discussed hereinafter.

In the example 3, sequential picking-up of the dies D from all of or a predetermined number of wafers is performed while controlling the wafer holding stage 14 and the dies D are carried on, for example, the alignment stage 31B which is located on the pick-up head 21 side. When the respective dies are to be carried on the alignment stage 31B, a judgment is made whether the zero-degree postures of the dies and the 180 degrees postures occur, and placing of the dies is performed. On the other hand, the bonding head 41 causes a plurality of dies D already carried on the alignment stage 31A to be sequentially laminated and bonded to the substrate P or already-bonded dies, during the pick-up head 21 places the dies on alignment stage 31B.

FIG. 7 shows a state where, after the pick-up head 21 places four dies on the alignment stage 31A, it is about to place a 1-st die on the alignment stage 31B which has moved to the push-up unit 13 side. FIG. 7 also shows a state where the bonding head 41 has picked up a 1-st die from the alignment stage 31A, which has moved to the substrate side, and has performed the bonding.

Example 4

While the example 3 is provided with the two alignment stages 31A, 31B on which a plurality of dies can be carried, a example 4 is provided with one alignment stage 31 on which one or two dies can be carried, like the examples 1 and 2. Therefore, as a die rotating means of the example 4, there may be employed the die rotating means of either the example 1 or the example 2.

In the examples 3 and 4, the bonding head 41 also performs the bonding of the die D always in the same zero-degree posture without being rotated through 180 degrees, so that the generation of the void between the dies can be decreased. Moreover, the rotational center-shift due to the inclination is not produced and it is possible to laminate the dies with the good precision.

Consequently, according to the examples 3 and 4, it is also possible to provide the die bonder and bonding method which can provide high-quality products particularly even if the die is rotated through 180 degrees relative to the already-bonded die and then laminated to it.

The case where the posture of the die is rotated through 180 degrees has been described with reference to the above-explained examples 1-4. In a case where the die has a square shape, the die may be rotated through ±90 degrees except the rotation of 180 degrees. In this case, the alignment stage 31 or the pick-up head 21 is rotated through ±90 degrees.

While the invention has been described in terms of the several embodiments, those skilled in the art will recognize that the invention can be practiced with various alternatives, modification, or changes within the spirit and scope of the appended claims.

What is claimed is:

1. A bonding method comprising:
   a picking-up step of picking up a die from a wafer by a pick-up head and placing the die on an alignment stage by setting the die away from the pick-up head;
   a bonding step of picking up the die from the alignment stage by a bonding head and bonding the die onto a substrate or an already-bonded die;
   a step of judging whether the die is rotated through the predetermined degrees, before the bonding head picks up the die from the alignment stage; and
   a die rotating step of rotating horizontally a posture of the die, which is picked up by the pick-up head, through predetermined degrees on a plane parallel to a plane on which the bonding is performed, before the bonding head picks up the die from the alignment stage;
   wherein the method includes a step of providing two alignment stages;
   wherein the picking-up step of alternately performing in the two alignment stages to pick up dies from plural wafers and placing the dies on one of the two alignment stages; and
   wherein the method includes a step of moving the two alignment stages in directions opposite to each other parallel to movement direction of the bonding head.

\* \* \* \* \*